US005506853A

United States Patent [19]
Tegge

[11] Patent Number: 5,506,853
[45] Date of Patent: Apr. 9, 1996

[54] OFFSET STABILIZATION OF WIDE DYNAMIC RANGE INJECTION LASER DIODE WITH SINGLE BIT SAMPLING

[75] Inventor: Edward Tegge, Palm Bay, Fla.

[73] Assignee: Harris Corporation, Melbourne, Fla.

[21] Appl. No.: 346,267

[22] Filed: Nov. 23, 1994

[51] Int. Cl.[6] .................................................. H01S 3/13
[52] U.S. Cl. .................................................. 372/29; 372/38
[58] Field of Search .......................... 372/29, 38, 31, 372/32

[56] References Cited

U.S. PATENT DOCUMENTS

| | | | |
|---|---|---|---|
| 5,163,063 | 9/1992 | Yoshikawa et al. | 372/29 |
| 5,276,697 | 1/1994 | Davis | 372/29 |
| 5,412,677 | 5/1995 | Guerin et al. | 372/38 |
| 5,414,280 | 5/1995 | Girmay | 372/29 |
| 5,418,806 | 5/1995 | Araki | 372/29 |

*Primary Examiner*—Leon Scott, Jr.
*Attorney, Agent, or Firm*—Rogers & Killeen

[57] ABSTRACT

A laser driver for an injection laser diode (ILD) has a stable power offset. The laser driver drives a laser having an optical power output that includes (a) a variable portion for providing signals and (b) a power offset that is desirably stable. The power offset may be stabilized by providing a stable input reference to the laser driver during an interval of operation when the laser is not providing signals, the input reference providing an optical power output from the laser that is approximately the same as the power offset. The laser output generated by the input reference may be compared to a predetermined reference voltage in order to provide an error correction signal, which may be a single bit. The error correction signal may be fed back to an input to the laser to correct the power offset.

16 Claims, 4 Drawing Sheets

OFFSET STABILIZATION OF WIDE DYNAMIC RANGE INJECTION LASER DIODE WITH SINGLE BIT SAMPLING

BACKGROUND OF THE INVENTION

The present invention relates to image reproduction systems, and more particularly to a laser driver for fan injection laser diode and method of operating a laser driver in a high resolution laser recorder.

Laser image recorders may use a semiconductor laser diode (referred to herein as an injection laser diode, "ILD") to reproduce an image on a photographic media. The image is typically provided to the recorder in the form of digital or analog data that is used to modulate the ILD output to expose the photographic media. Due to the nature of the data and image, the operation of the device is complex. For example, recording resolution may be on the order of 300 pixels per inch, yielding nearly eight million pixels for an eight inch by eleven inch image. The image may be reproduced in about a half a minute (over 264,000 ILD operations per second) and may have 256 shades of gray with eight bits per pixel to describe the shading. Laser image recorders find application in a variety of fields, such as reconnaissance, medical (e.g., X-ray image reproduction), satellite imagery, computer-generated graphics, and the like.

The image reproduction process involves numerous steps in which an error in one step may be magnified in the next, and one of the more vexing problems encountered throughout the process is that of the effect of temperature on ILD operation. While the present invention addresses several problems, it may be more clearly understood by considering the invention as it addresses the temperature problems at several steps.

Baseline Drift.

Consider first the affect of temperature on the stability of the signal from the laser driver that controls ILD output. The relative range of operation of a laser driver for an ILD may be from 1 to 4000, and throughout this range the ILD desirably maintains a precise transfer function between the electrical input signal Vin (the information-bearing portion of the input), and the optical output power, Pout:

$$Pout=mVin+b \quad (1)$$

where, m is the gain of the laser driver, and b is the power offset of the laser driver. That is, the laser driver signal for controlling ILD output may be viewed as having a variable (modulated) information-bearing portion, mVin, and a fixed power offset (baseline) portion, b.

The stability of the offset b is highly desirable to the maintenance of a precise transfer function. However, changes in temperature (as well as other factors such as aging) cause the power offset b to drift (offset drift is also denoted baseline drift). The temperature changes that may cause baseline drift may be felt in various components and attempts to maintain the temperature of all the components have not proven workable in many applications. Drift control measures that rely on feedback have proven more successful. However, feedback methods for wide bandwidth, wide dynamic range laser drivers require a large number of components with very high stability.

ILD Protection.

Temperature may also affect ILD operation more directly because an ILD will be destroyed if it is provided with a current that exceeds a maximum value. Significantly, the allowable maximum current value changes with temperature. By way of further explanation, and with reference to FIG. 1, an ILD operating at the intersection of lines A and B (25° C., curve 2) may be provided with the forward current shown (the total of variable and fixed portions) and have the optical output power shown. If the forward current remains fixed, but the ILD temperature drops to 0° C. (curve 1) the ILD will have exceeded its maximum output and be destroyed. On the other hand, if the ILD temperature rises to 50° C. (curve 3) and the current remains on line A, the ILD's output will be reduced. The temperature curves such as shown in FIG. 1 are inherent characteristics of ILDs.

Several methods have been employed to protect the ILDs. One is to limit the amount of current available to drive the ILD by inserting a large ohmage resistor between the ILD and the available power source (voltage). The available current is thereby limited to:

$$I=(V-Vd)/R \quad (2)$$

where V is available voltage, Vd is ILD "on" voltage, and R is the ohmage of the limiting resistor. In this approach, the problem of temperature induced variations of maximum current is resolved by setting the maximum available current (by selection of R) at a value less than a value that would destroy the ILD at anticipated operating temperatures. This, of course, limits the range of operation of the ILD. Further, the resistor dissipates power, and the large ohmage of the resistor limits the bandwidth of ILD modulation.

In another method of protecting the ILD, the optical output power of the ILD is monitored and a corrective feedback signal is generated to lower or stop the ILD drive signal when a predetermined maximum power has been exceeded. However, a significant amount of time is needed to determine whether the maximum power has been exceeded, to feed a signal back to the laser driver, and for the laser driver to take corrective action. This time delay limits the bandwidth and the dynamic range over which the ILD can be used.

Accordingly, it is an object of the present invention to provide a novel device and method of operating a laser driver in which the baseline drift problem is obviated by reducing the number of laser driver components that control the baseline temperature drift.

It is a further object of the present invention to provide a novel device and method of stabilizing baseline drift in a laser driver in which a test of baseline drift is made during an interval of laser driver operation when information-bearing signals are not being processed.

It is yet a further object of the present invention to provide a novel device and method of stabilizing baseline drift in a laser driver in which a predetermined reference signal is provided when it will not interfere with normal operation, and the ILD output generated by the reference signal is compared to an expected output to provide a corrective feedback to the laser driver.

It is still a further object of the present invention to provide a novel device and method of stabilizing baseline drift in a laser driver in which each comparison of an ILD output from a predetermined reference signal to an expected output is provided from a one bit converter.

It is also a further object of the present invention to provide a novel device and method of stabilizing baseline drift in a laser driver in which plural one-bit results of comparisons of ILD outputs to expected outputs are averaged to reduce the noise of the laser driver.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 2:
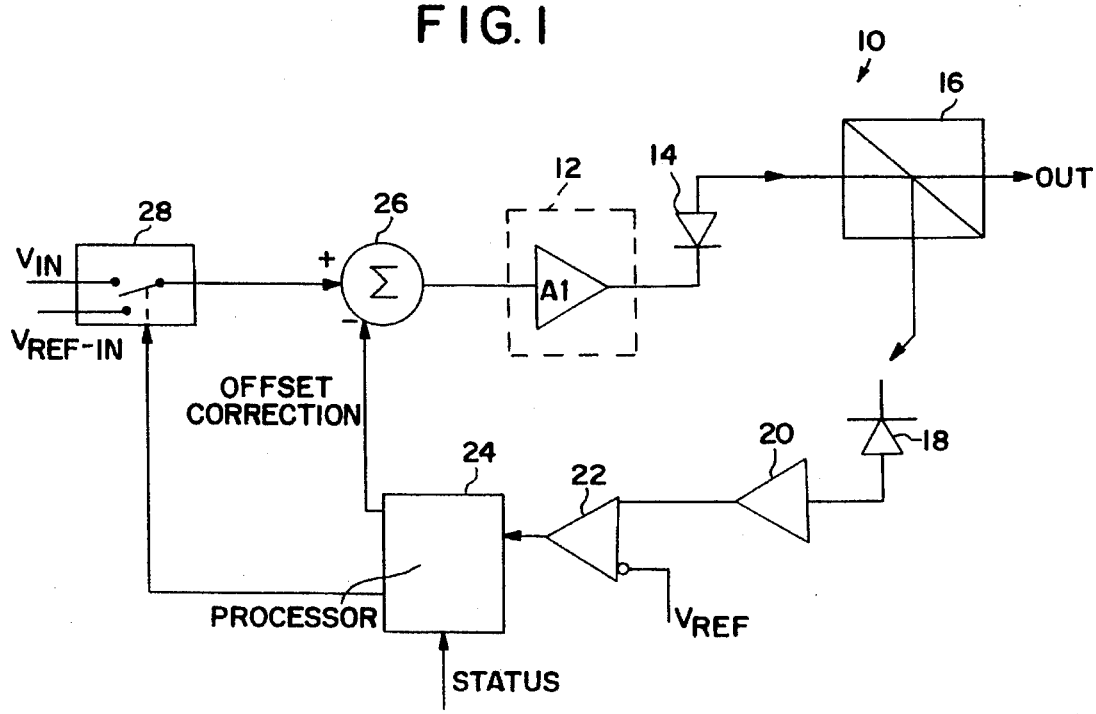
FIG. 2 is a block diagram of an embodiment of the baseline drift correction circuit of the present invention.

With reference now to FIG. 2, a circuit 10 in a laser driver for correcting baseline drift may include a servo circuit 12, discussed further below, for providing a drive signal to an ILD 14. The drive signal includes an input modulated portion (mVin from Equation 1 above) and a power offset (b from Equation 1) provided by the servo circuit 12. A portion of the ILD output is split off in beamsplitter 16 and provided to a detector 18. The output from the detector 18 may be amplified in amplifier 20 and provided to comparator 22. In the comparator 22, the detected output is compared to a predetermined reference voltage Vref and the result of that comparison is fed to a processor 24 that generates a baseline correction signal during certain intervals of circuit 10 operation discussed below. The baseline correction signal is provided to summer 26 for correction of the power offset from the servo circuit 12.

In the operation of the circuit 10, the processor 24 operates switch 28 based on an evaluation of a status signal indicating whether information bearing signals are being processed. The status signal may be provided to the laser driver conventionally to indicate when information signals are being provided. The input signal Vin is selected by switch 28 when information-bearing signals are being processed and output from the ILD, such as when pixels are being generated. When information-bearing signals are not being provided in an interval of operation of the laser driver, such as at the end of line of pixels, the switch 28 selects a reference signal Vref-in as an input. The reference signal Vref-in desirably is a stable, low drift reference voltage that causes the ILD to generate an output that is the power offset provided by the servo circuit 12, and that also includes noise that may be present in the circuit 10. This output is compared in comparator 22 to a stable, low drift reference voltage Vref that is substantially the same as the desired, stable power offset b. If the power offset provided by the servo circuit 12 is correct (that is, it is equal to b) the only difference sensed by comparator 22 will be the noise in the circuit 10. If the power offset provided by the servo circuit 12 is not correct, the comparator provides an indication to the processor which sends an offset correction signal to the summer to compensate for the incorrect offset. The offset correction may be provided continuously to the summer 26, but the correction is not changed when information bearing signals are being processed.

In a preferred embodiment the comparator 22 is a one bit converter for providing a single bit error signal indicating which way the offset is to be corrected. The error signal may indicate the larger of the detected signal from the detector 18 and the signal Vref.

The noise sensed by the comparator 22 may be reduced by integrating a plurality N of the correction signals. The processor 24 may store the correction signals and compute a running average of the last N signals. The running average may be used to provide correction signals to the summer 26 that reduce noise by the square root of N, and to compute the quantitative value of the power offset. The processor 24 may convert the running average to an analog signal for the summer 26. In a preferred embodiment the correction signals are one bit error signals and N is 128.

Figure 3:
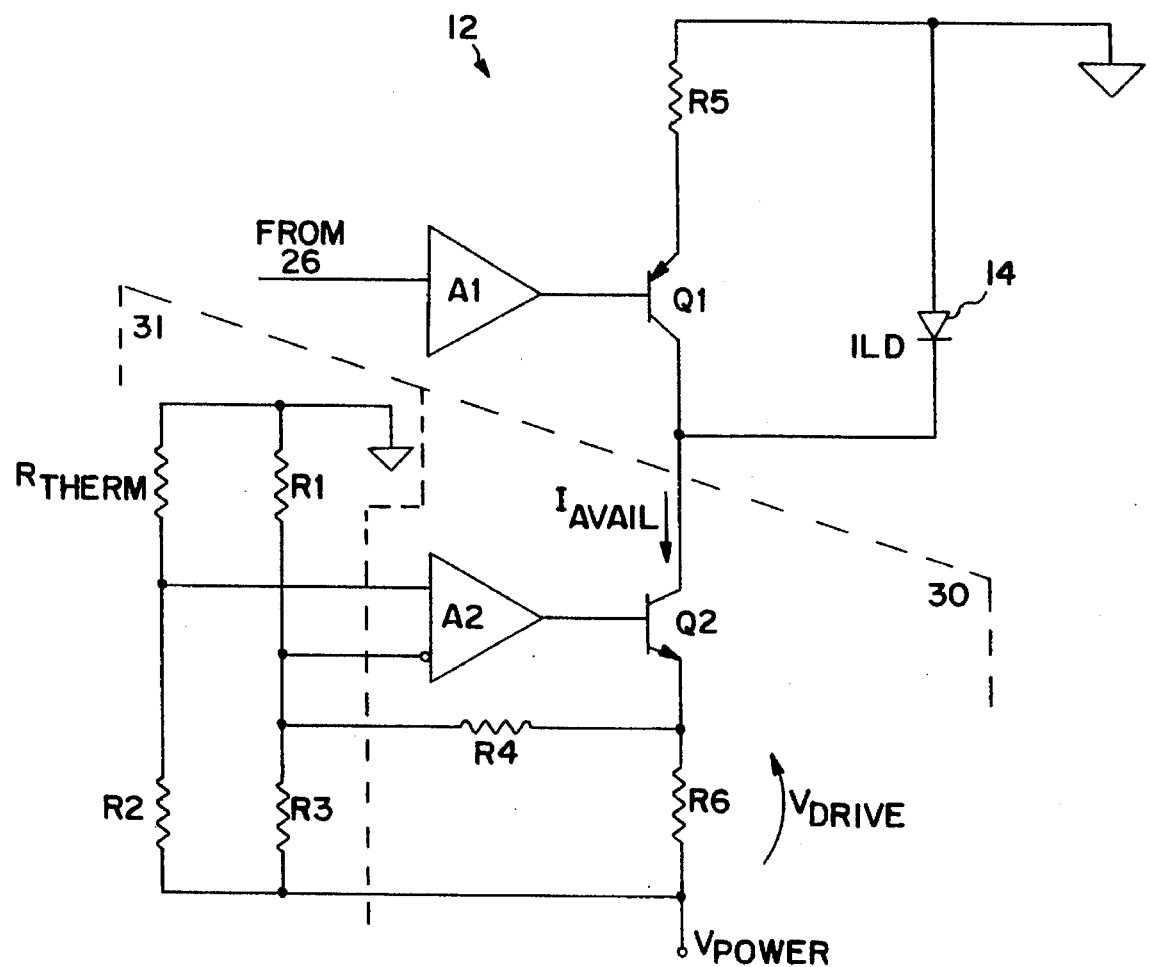
FIG. 3 is a block diagram of an embodiment of the ILD protection circuit of the present invention.

With reference now to FIG. 3 a laser driver servo circuit 12 for providing a drive signal to an ILD may also protect an ILD, and to this end may include circuitry 30 that may include a bridge network 31 and voltage source Vpower for varying the current available Iavail to drive the ILD as a function of ILD temperature. The circuitry 30 controls the maximum current available to drive the ILD by varying the drive voltage Vdrive responsive to ILD temperature changes so that the ILD will not be destroyed. A thermistor Rtherm in the bridge network 31 may be located adjacent (e.g., thermally bonded) to the ILD so that it may sense ILD temperature variations.

Figure 1:
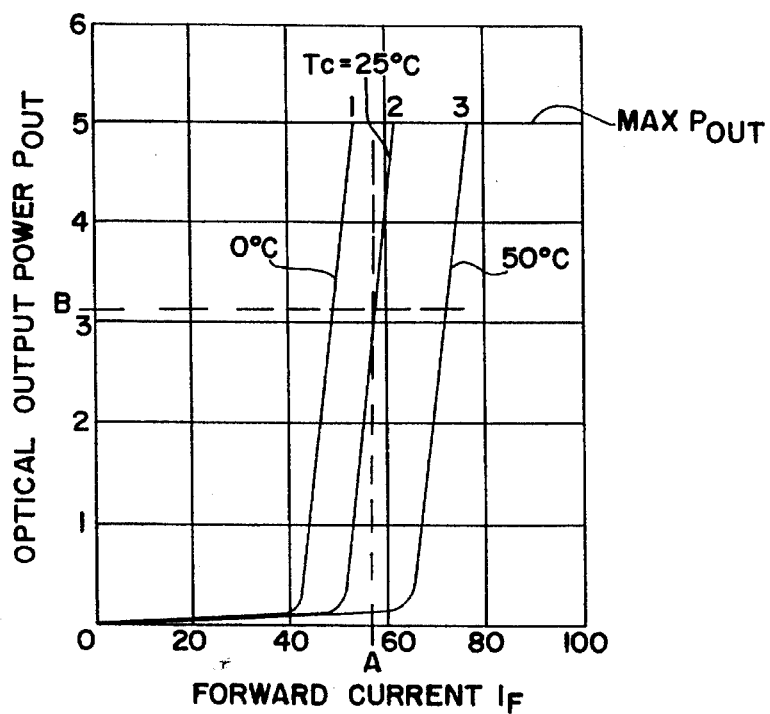
FIG. 1 is a graph illustrating an example of ILD optical output power versus forward current as a function of ILD temperature.

The available current Iavail may be provided to the ILD through a transistor Q2 that receives a base current from and has its output voltage modified by amplifier A2. The inputs to the amplifier A2 are a first voltage Vtemp that is responsive to ILD temperature changes and a second voltage Vintemp that is not. These two voltages may be developed by the bridge network 31 having fixed resistors, R1, R2, and R3, and the thermistor Rtherm. The bridge network 31 may be connected between the power voltage Vpower and ground. The values of R1, R2, and R3 and of the amplifier feedback resistor R4 may be selected so that the drive voltage Vdrive does not change with changes of Vpower. This selection causes the current available Iavail to be insensitive to changes in Vpower. Thus, the circuitry 30 provides two levels of stability: first, as the temperature of the ILD 14 changes, the current available to drive the ILD is changed by the amount needed to protect the ILD while maintaining its full operating range, and second, in the event Vpower fluctuates the bridge 31 and circuitry 30 change Vdrive so that Iavail remains constant. With reference to FIG. 1, the circuitry 30 keeps the ILD on its proper temperature curve by increasing available (forward) current as ILD temperature increases and decreasing available (forward) current as ILD temperature decreases.

The servo circuit 12 may also operate the ILD at an "on" level so that modulation operates by shunting available current to turn the laser "off". That is, many prior art lasers operated by operating the laser "off" and modulated the output by increasing the available current to turn the laser "on". The servo circuit 12 may operate in the reverse by shunting current away from the ILD when the output is to be modulated. As may be seen in FIG. 3, the amplifier A1 receives an input signal from the summer 26 (FIG. 2) and drives transistor Q1 to shunt current away from ILD 14. Desirably all of the current is shunted (near zero current available for the ILD) during "low" or "off" modulation. With the circuit 12 operating in this manner the maximum operating current cannot be exceeded by the modulation.

Figure 4A:
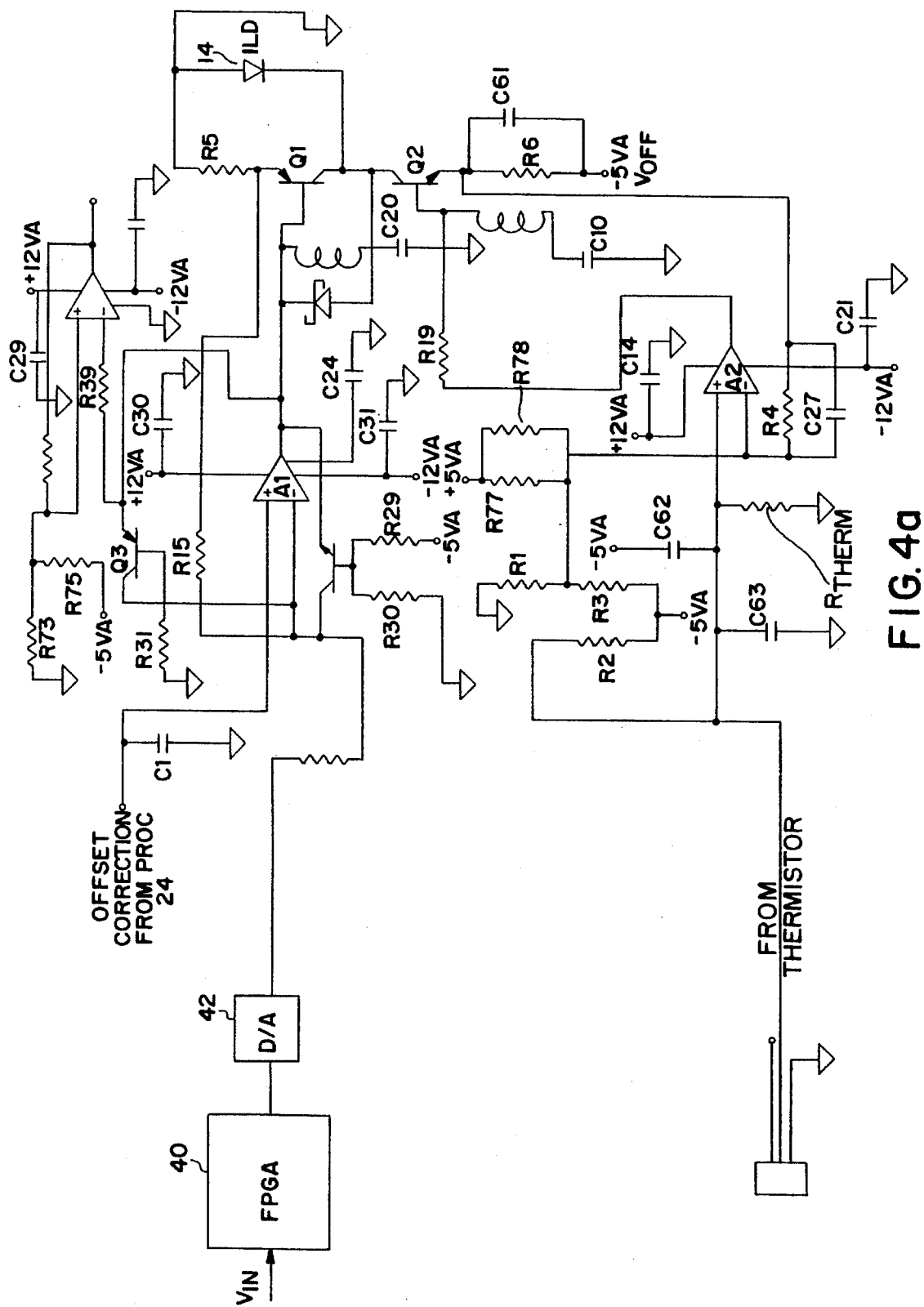
FIGS. 4a–4b are circuit diagrams of portions of an embodiment of the present invention.

In a preferred embodiment of the present invention, and with reference to FIG. 4a, an input video signal Vin may be a serial, differential digital word (differential signals have a positive part and a negative part) that may be conventionally converted to a single ended signal. Component identifiers from FIGS. 2 and 3 have been retained in FIGS. 4a–4b for similar components in the interest of clarity. The single ended word may be fed to a digital switch in a field programmable gate array (FPGA) 40 that performs the functions of switch 28. The output of the FPGA 40 may be fed to a digital to analog converter 42 that provides an analog signal to a circuit that performs the functions of the summer 26 and servo circuit 12. The offset correction from the processor 24 and the analog signal from converter 42 are provided to amplifier A1 that drives transistor Q1 that operates in the manner discussed above in relation to FIG. 3. The FPGA 40 may also provide Vref-in and the converter 42 may convert the signal to analog when the reference input is selected in switch 28.

With further reference to FIG. 4a, an embodiment of the ILD protection circuit may include amplifier A2 driving transistor Q2 to vary the drive voltage responsive to temperature changes sensed by the thermistor Rtherm.

Figure 4B:
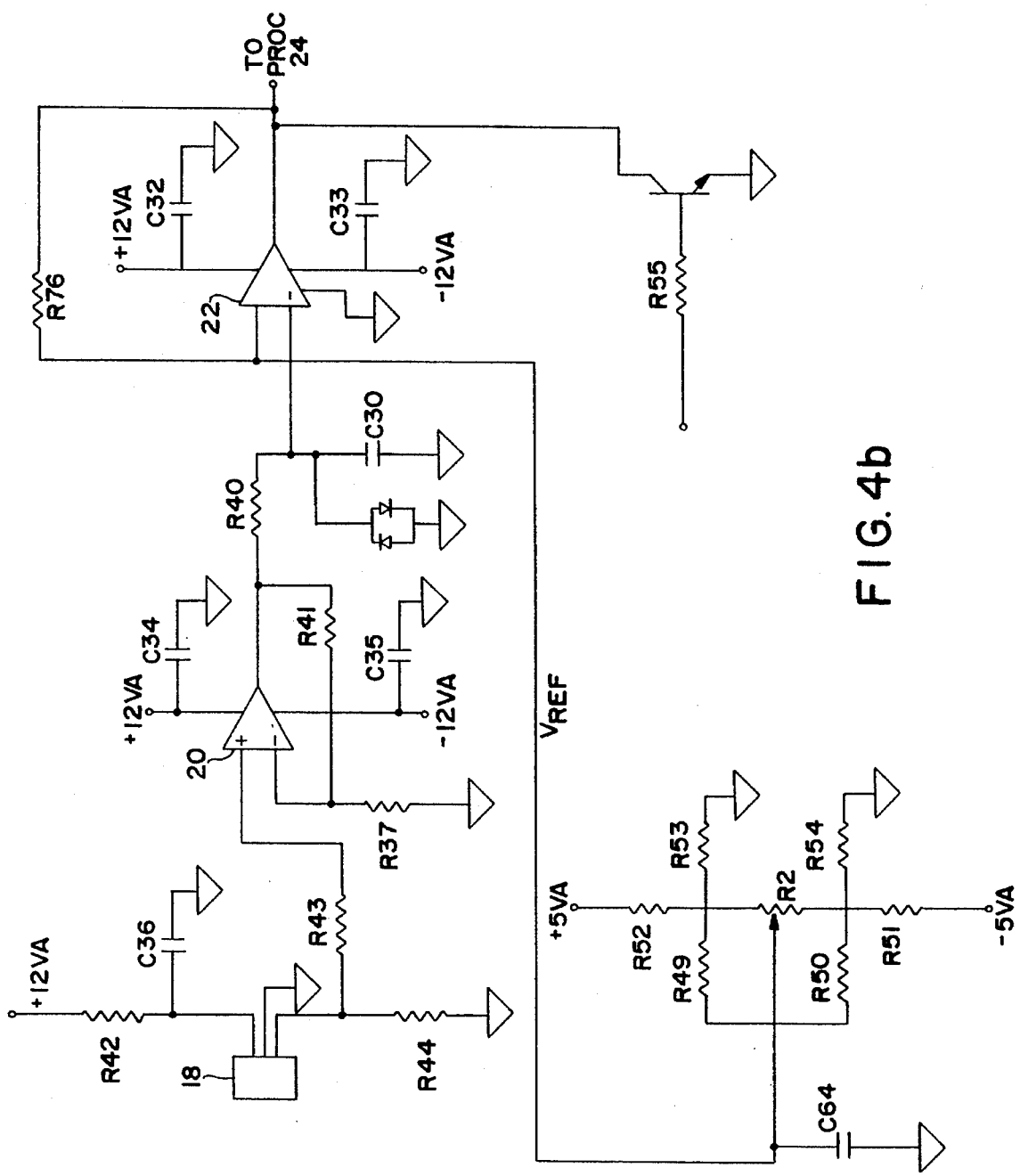

The feedback detection circuit comprising detector 18, amplifier 20 and comparator 22 may be seen in FIG. 4b. The feedback detection circuit provides one bit correction signal to the digital processor that may be implemented in the FPGA 40.

In a further embodiment, the comparator 22 may be a register for measuring the detected signal from the detector 18 and for providing a corresponding correction signal to the processor 24. The correction signal may comprise more than a single bit.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A method of stabilizing drift in a laser driver that drives a laser having an optical power output that includes (a) a variable portion for providing signals and (b) a power offset that is desirably stable, the method comprising the steps of:

(a) providing a stable input reference to the laser driver during an interval of operation of the laser driver when the laser is not providing signals, the input reference for providing an optical power output from the laser that is approximately the same as the power offset;

(b) detecting a laser output generated by the input reference;

(c) comparing a voltage representative of the detected laser output to a predetermined reference voltage in order to provide a correction signal, the predetermined reference voltage being approximately equal to the voltage representative of the detected laser output when the optical power output of the laser is approximately the power offset; and (d) feeding back the correction signal resulting from the comparison to an input to the laser to correct the power offset.

2. The method of claim 1 wherein the correction signal is an average of N comparisons.

3. The method of claim 1 wherein the correction signal is one bit in length.

4. The method of claim 1 wherein the correction signal is an average of N one bit long comparison results, whereby noise in the correction signal is reduced.

5. The method of claim 4 further comprising the step of converting the correction signal to an analog signal.

6. The method of claim 1 wherein the correction signal is an average of N one bit long comparison results, and further comprising the step of determining the power offset from the correction signal.

7. A method of stabilizing drift of a baseline in a laser driver, the method comprising the steps of:

(a) switching an input for the laser driver to an input reference during non-informational intervals in the of operation of the laser driver, the input reference being stable and for providing a laser optical power output that is approximately the same as the baseline;

(b) detecting a laser output generated by the input reference; and (c) comparing the detected laser output to a predetermined reference to provide a one bit error signal for each of the intervals, the predetermined reference being approximately equal to the detected laser output when the optical power output of the laser is approximately the baseline, whereby the error signals from the intervals may be used to correct baseline drift.

8. The method of claim 7 further comprising the step of providing a running average of N of the one bit error signals to an input to the laser to correct baseline drift.

9. The method of claim 8 further comprising the step of converting the average of the one bit error signals to an analog signal.

10. A device for stabilizing baseline drift in a laser driver comprising:

a switch for alternatively providing to the laser driver one of (a) an input signal having an amplitude related to desired output power of a laser driven by the laser driver, and (b) a stable reference that provides a laser optical power output that is approximately the same as a baseline portion of the input signal, said switch providing said stable reference during an interval of operation of the laser driver between ones of said input signal;

a detector for detecting a laser output generated by said input reference; and a digital converter for comparing the detected laser output to a predetermined reference to provide a one bit error signal for each said interval, said predetermined reference being approximately equal to said baseline portion, whereby said error signals from said intervals may be used to correct baseline drift.

11. The device of claim 10 further comprising a processor for providing a running average of N said one bit error signals.

12. The device of claim 11 further comprising a digital to analog converted for converting said running average to an analog signal.

13. A device for stabilizing drift in a laser driver that drives a laser having an optical power output that includes (a) a variable portion for providing signals and (b) a power offset that is desirably stable, the device comprising:

means for providing a stable input reference to the laser driver during an interval of operation of the laser driver when the laser is not providing said signals, said input reference for providing an optical power output from the laser that is approximately the same as said power offset;

a laser detector for detecting a laser output generated by said input reference;

a comparator for comparing a voltage representative of the detected laser output to a predetermined reference voltage in order to provide a correction signal, said predetermined reference voltage being approximately equal to the voltage representative of the detected laser output when the optical power output of the laser is approximately said power offset, and a feed back for providing said correction signal resulting from the comparison to an input to the laser to correct said power offset.

14. The device of claim 13 further comprising a servo circuit for providing the power offset and for receiving said correction signal.

15. The device of claim 13 further comprising a beam splitter for providing a portion of a laser output to said laser detector.

16. The device of claim 13 wherein said feed back comprises a summer for combining said correction signal with an output from said means for providing a stable input reference to the laser whereby laser driver drift is corrected.

* * * * *